United States Patent
Ichitsubo et al.

(10) Patent No.: US 6,822,515 B2
(45) Date of Patent: Nov. 23, 2004

(54) ACCURATE POWER SENSING CIRCUIT FOR POWER AMPLIFIERS

(76) Inventors: Ikuroh Ichitsubo, 4-6-3-501 Araisono, Sagamihara, Kanagawa Prefecture (JP); Weiping Wang, 4044 Sutherland Dr., Palo Alto, CA (US) 94303

( * ) Notice: Subject to any disclaimer, the term of this patent is extended or adjusted under 35 U.S.C. 154(b) by 0 days.

(21) Appl. No.: 10/385,059

(22) Filed: Mar. 9, 2003

(65) Prior Publication Data

US 2004/0012446 A1 Jan. 22, 2004

Related U.S. Application Data

(60) Provisional application No. 60/397,261, filed on Jul. 19, 2002.

(51) Int. Cl.[7] .................................................. H03G 3/10
(52) U.S. Cl. .......................... 330/285; 330/296; 330/302
(58) Field of Search ................................. 330/285, 288, 330/295, 296, 302

(56) References Cited

U.S. PATENT DOCUMENTS

| 5,880,635 A | * | 3/1999 | Satoh ........................... 330/144 |
| 6,198,351 B1 | * | 3/2001 | Winslow ....................... 330/298 |
| 6,262,630 B1 | * | 7/2001 | Eriksson ....................... 330/289 |
| 6,265,943 B1 |   | 7/2001 | Dening et al. |

* cited by examiner

Primary Examiner—Khanh Van Nguyen

(57) ABSTRACT

An amplifier circuit for amplifying radio frequency signals having temperature compensation and bias compensation includes a radio frequency power amplifier that receives an input radio frequency signal and outputs an amplified radio frequency signal, and a first transistor performing as a detector diode with its collector and base connected. The base of the first transistor receives the amplified radio frequency signal from the power amplifier, a second DC bias input signal from a regulated DC source, and a third power-sensing signal. The amplifier circuit further includes a second transistor to amplify the DC component of the RF signal from the base of the first transistor. The base of the second transistor is coupled to the base of the first transistor. The collector of the second transistor outputs the power-sensing signal, which is coupled to the regulated DC source through a resistor.

17 Claims, 2 Drawing Sheets

Figure 1: Prior Art

ACCURATE POWER SENSING CIRCUIT FOR POWER AMPLIFIERS

This application claims priority to Provisional Application Ser. No. 60/397,261, filed on Jul. 19, 2002, titled "Power Amplifier Modules for Wireless LAN Applications", the content of which is hereby incorporated by reference.

RELATED APPLICATION

The present invention is related to the commonly assigned U.S. patent application Ser. No. 10/041,863, filed on Oct. 22, 2001, titled "Multilayer RF Amplifier Module", by Wang, et al., and the commonly assigned and concurrently filed U.S. patent application "Power Amplifier Module for wireless communication devices" by Ichitsubo et al. The disclosures of these related applications are incorporated herein by reference.

TECHNICAL FIELD

The present invention relates generally to radio frequency (RF) power amplifiers, more specifically, to power sensing for RF power amplifiers.

BACKGROUND

Radio frequency transmission of an electrical signal occurs in a broad frequency spectrum from several megahertz (MHz) to tens of gigahertz (GHz). Common RF transmission systems include an antenna that transmits and receives RF signals and a low noise amplifier that amplifies an input RF signal from the antenna and a power amplifier to generate an amplified signal to be delivered to the antenna. The power of the output signals from the power amplifiers are required to be controlled within stringent specifications as well as regulatory standards, to assure the quality of the RF transmission signals. Moreover, many portable wireless systems are required to increase or reduce the transmitted power depending upon signal strength, transmission range, the types of digital signal modulation such as Quadrature Phase Shift Keying (QPSK) and Orthogonal Frequency Division Multiplexing (OFDM), as well as surrounding interfering signals. These requirements can be met by a power sensing circuit that samples the output power of the power amplifier and outputs a power sensing signal for power control. However, variations in power sensing signals due to temperature and DC bias are also passed on to the power output through the control loop. Variations in power sensing signals can significantly affect the qualities of the output RF signals. A need therefore exists for accurate and reliable techniques for power sensing for RF power amplifiers with good temperature and DC bias compensations.

SUMMARY

The invention system generally includes a power sensing circuit for sensing radio frequency signals, comprising:
  a) a first transistor to perform as a detector diode, including
    i) a first base to receive a first radio frequency input signal output, a second DC bias signal from a regulated DC source coupled through a resistor, and a third power-sensing signal; and
    ii) a first collector connected to the first base;
  b) a second transistor to amplify the DC component of the RF signal from the first base, including
    i) a second base connected to the first base through a low-pass filter; and
    ii) a second collector to output the power-sensing signal to be coupled to the regulated DC source through a resistor, said power-sensing signal being substantially proportional to the strength of the first radio frequency input signal; and
  c) an output port coupled to the second collector through a low-pass filter, to output the power-sensing signal.

In one aspect, the present invention provides a power sensing circuit for detecting power of a power amplifier. The power sensing circuit includes a detector diode using a transistor and a DC amplifier using a second transistor. The second transistor acts as a current mirror circuit regarding the DC current component of the first transistor and compensates variations in the power sensing circuit. The power sensing signal is provided in a single output terminal.

In another aspect, the present invention provides a circuit design that is simple and easy to implement using Heterojunctioh Bipolar Transistors (HBT) materials such as InGaP/Ga As which improves reliability relative to prior art.

An advantage of the present invention is that the temperature variation of the power sensing circuit is properly compensated to provide accurate power sensing at a wide temperature range.

Another advantage of the present invention is that the invention power sensing circuit directly senses the final output RF signal and can thus inclusively detect variations in the whole power amplifying circuit.

Yet another advantage of the present invention is that the invention power sensing circuit is simpler and easier to implement compared to prior art systems.

The details of one or more embodiments are set forth in the accompanying drawing and in the description below. Other features, objects, and advantages of the invention will become apparent from the description and drawings, and from the claims.

BRIEF DESCRIPTION OF THE DRAWINGS

The accompanying drawing, which are incorporated in and form a part of this specification, illustrate embodiments of the invention and, together with the description, serve to explain the principles of the invention.

DESCRIPTION OF INVENTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well known methods, procedures, components, and circuits have not been described in detail as not to unnecessarily obscure aspects of the present invention.

Figure 1:
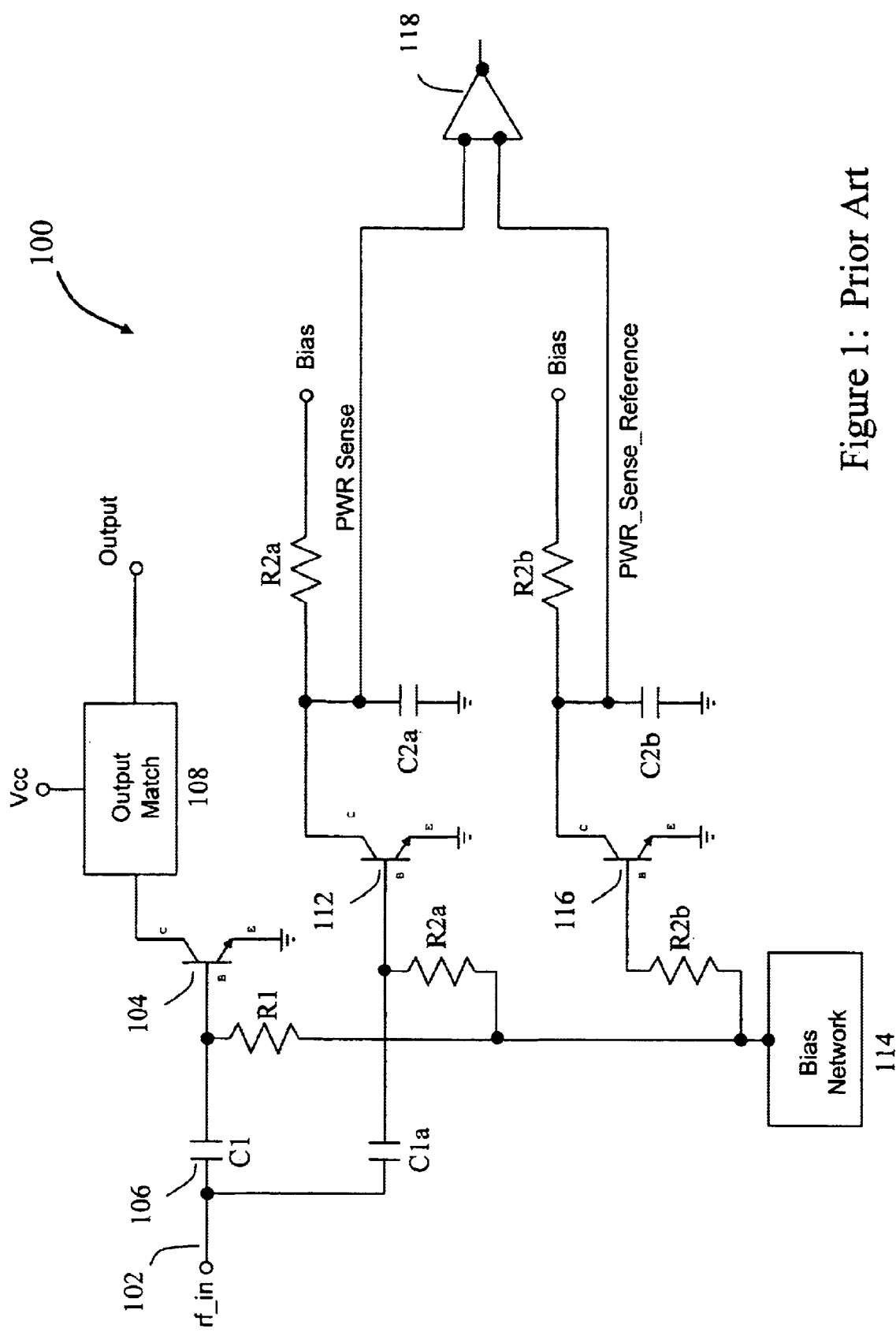
FIG. 1 is a simplified schematic diagram illustrating a RF power sensing circuit in the prior art.

FIG. 1 shows a simplified schematic diagram of a prior art system 100 disclosed in U.S. Pat. No. 6,265,943. A RF signal is received by the prior art system 100 at the RF-in signal port 102 where it is coupled to a RF amplifier transistor 104 via coupling capacitor 106. An output matching network 108 provides impedance matching to the antenna to provide efficient transmission of the amplified RF signal to the associated antenna. A small RF sampling transistor 112 is deployed in parallel with the RF amplifier transistor 104, which is physically much larger than the small sampling transistor 112. The small sampling transistor 112 is DC biased via a dedicated bias network 114. The size of the small sampling transistor 112 may, for example, be about $\frac{1}{250}_{th}$ the size of the RF amplifier transistor 104.

The prior art system 100 includes a second small sampling transistor 116 to compensate for a dominating quiescent bias current at low power levels. This second small sampling transistor 116 is also physically much smaller than the RF amplifier transistor 104 and is optionally the same physical size as the first small sampling transistor 112. The second small RF sampling transistor 116 is deployed in parallel with the first small sampling transistor 112, however, it does not receive any of the RF drive energy from the input stage. Rather, the second small sampling transistor 116 amplifies and receives only the bias current from the bias networking 114. The predicted power can be corrected for bias current effects and bias current shifts. A differential amplifier 118 is connected between the PWR_Sense and PWR_Sense_Reference in order to cancel erroneous contributions of the bias current to the predicted power.

Figure 2:
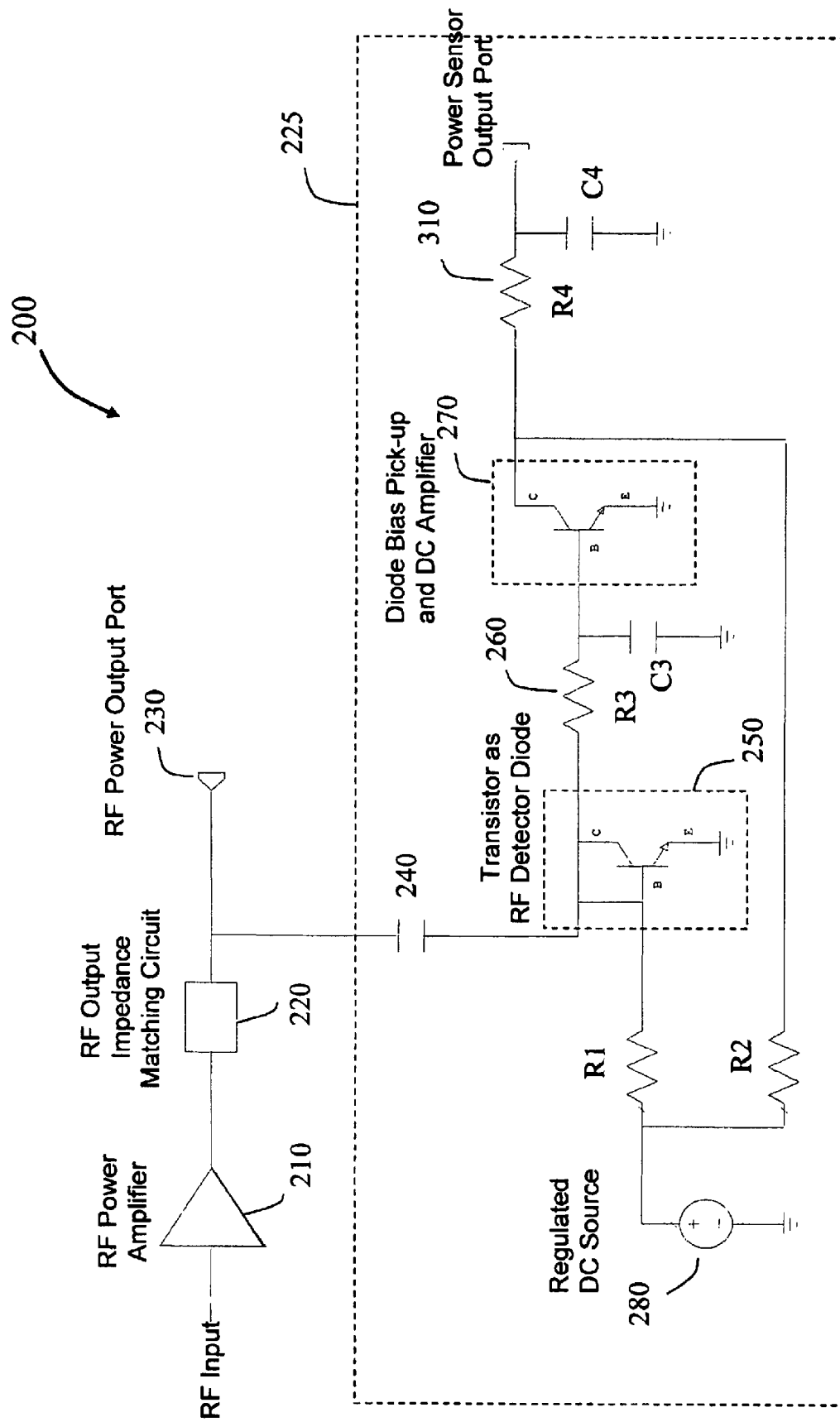
FIG. 2 is a schematic circuit diagram illustrating a RF amplifier circuit having power sensing in accordance to the present invention.

Illustrated in FIG. 2 is a schematic circuit diagram of a RF amplifier circuit 200 in accordance to the present invention. The RF amplifier circuit 200 includes a RF power amplifier 210, a RF output impedance matching circuit 220 and RF power output port 230. The RF amplifier circuit 200 also includes a RF power sensing circuit 225 that senses the amplified RF signal output by the RF power amplifier 210 and through the RF output impedance matching circuit 220. The RF power sensing circuit 225 includes a first transistor 250 that detects RF signal from the output of RF power amplifier 210 through a coupling capacitor 240. The base and the collector of the first transistor 250 are electrically connected so that the first transistor 250 acts as a diode. The current flowing into the first transistor 250 (Detector) depends on the output RF voltage of the RF power amplifier 210. The RF power sensing circuit 225 also includes a second transistor 270 having its base connected to the base of the first transistor 250 through a low-pass filter 260 (R3, C3). The second transistor 270 thus functions as a DC amplifier of the DC bias diode (i.e. the first transistor 250).

The collector of the second transistor 270 is coupled to a regulated DC source 280 by resistor R2. The base and the collector of the first transistor 250 are coupled to a regulated DC source 280 by resistor R1. The regulated DC source 280 provides a temperature-compensated, constant voltage well known in the art.

In this circuit layout, the second transistor 270 acts as a current mirror circuit regarding the DC current component of the first transistor 250. That is:

$$I_2 = S \times I_1,$$

wherein S is the size ratio of the second transistor 270 to the first transistor 250, and $I_1$ and $I_2$ are the currents flowing through the bases of the first transistor 250 and the second transistor 270 respectively. S=1, if the sizes of the two transistors are the same.

The output RF voltage of the RF power amplifier 210 can be picked up at the collector voltage of the second transistor 270. The output signal of the RF power sensing circuit 225 is coupled to the collector of the second transistor 270 through a low-pass filter (R4, C4) that acts as a buffer to isolate the RF power sensing circuit 225 from external RF signals. The output signal of the RF power sensing circuit 225 is substantially proportional to the strength of the amplified radio frequency signal output by power amplifier 210.

The RF amplifier circuit 200 and the RF power sensing circuit 225 illustrated in FIG. 2 are simple and easy to implement in Heterojunctioh Bipolar Transistor (HBT) Integrated Circuits, for example, using Gallium Arsenide materials. The detector diode (i.e. the first transistor 250) and the DC amplifier (i.e. the second transistor 270) are proximity with each other. The first transistor 250 and the second transistor 270 therefore experience correlative temperature variations (thus similar variations in I-V response curves). For example, an upward temperature fluctuation causes the $I_1$ to rise and first base voltage to drop, which also causes second base voltage to drop and $I_2$ to drop. The counter balance between the two effects effectively compensates temperature variations.

Several advantageous distinctions can be found in the RF amplifier circuit 200 and the RF power sensing circuit 225 in the present invention, in comparison to the prior art system 100. One important design difference is that the invention RF power sensing circuit 225 in FIG. 2 directly senses the output signal from the power amplifier 210 and the RF output impedance matching circuit 220 whereas the prior art system 100 senses the input signal to RF amplifier transistor 104. The variations that the invention RF power sensing circuit 225 senses includes variations arisen from the RF power amplifier 210 and the output impedance matching circuit 220. In contrast, the prior art system 100 does not detect and thus cannot compensate variations in the RF amplifier transistor 104 and/or the output matching network 108. Variations in the RF amplifier transistor and output matching circuit can be caused, for example, by temperature variations, batch-to-batch variability in component fabrication, and operation variability over a component's life cycle, etc.

Another advantage of the present invention is that the design of a single output terminal in FIG. 2 is easier to use compared to the prior art system 100 in FIG. 2. The first and the second transistors 250, 270 are in close proximity to each other and thus experience correlative temperature variations. The temperature and bias variations within RF power sensing circuit 225 are inherently compensated in the current mirror circuit of the two transistors. In contrast, the prior art system 100 includes parallel transistors and multiple terminals. The prior art system 100 also relies on an additional differential amplifier to cancel erroneous contributions of the bias current.

Although specific embodiments of the present invention have been illustrated in the accompanying drawings and described in the foregoing detailed description, it will be understood that the invention is not limited to the particular embodiments described herein, but is capable of numerous rearrangements, modifications, and substitutions without departing from the scope of the invention. The following claims are intended to encompass all such modifications.

What is claimed is:

1. An amplifier circuit for amplifying radio frequency signals having temperature compensation and bias compensation, comprising:

a) a radio frequency power amplifier to receive an input radio frequency signal and to output an amplified radio frequency signal;
b) a first transistor to perform as a detector diode, including
   i) a first base to receive the amplified radio frequency signal, a second DC bias input signal from a regulated DC source, and a third power-sensing signal; and
   ii) a first collector connected to the first base; and
c) a second transistor to amplify the DC component of the RF signal from the first base, including
   i) a second base coupled to the first base; and
   ii) a second collector to output the power-sensing signal, said power-sensing signal being coupled to the regulated DC source through a resistor.

2. The amplifier circuit of claim 1 wherein the power-sensing signal is substantially proportional to the strength of the amplified radio frequency signal.

3. The amplifier circuit of claim 1 wherein the power-sensing signal is provided to an external circuit through a low-pass filter.

4. The amplifier circuit of claim 1 wherein the regulated DC source is coupled to the first base of the first transistor through a resistor.

5. The amplifier circuit of claim 1 wherein the first base of the first transistor is coupled to the second base of the second transistor through a low-pass filter.

6. The amplifier circuit of claim 1 wherein the output of the radio frequency power amplifier is coupled to the first base of the first transistor through a capacitor.

7. The amplifier circuit of claim 1 wherein the output of the radio frequency power amplifier is connected to an impedance-matching circuit which in turn is coupled to the first base of the first transistor.

8. The amplifier circuit of claim 1 wherein the size of the first transistor is the same as the size of the second transistor.

9. The amplifier circuit of claim 1 wherein at least one of the radio frequency power amplifier, the first transistor, and second transistor is fabricated with a Heterojunction Bipolar Transistor (HBT).

10. The amplifier circuit of claim 1 wherein the input radio frequency signal is modulated at a frequency in the range of 1 MHz to 10 GHz.

11. A power sensing circuit for sensing radio frequency signals, comprising:
   a) a first transistor to perform as a detector diode, including
      i) a first base to receive a first radio frequency input signal output, a second DC bias input signal from a regulated DC source, and a third power-sensing signal; and
      ii) a first collector connected to the first base; and
   b) a second transistor to amplify the DC component of the RF signal from the first base, including
      i) a second base coupled to the first base; and
      ii) a second collector to output the power-sensing signal, said power-sensing signal being coupled to the regulated DC source through a resistor.

12. The power sensing circuit of claim 11 wherein the power-sensing signal is substantially proportional to the strength of the first radio frequency signal.

13. The power sensing circuit of claim 11 wherein the power-sensing signal is provided to an external circuit through a low-pass filter.

14. The power sensing circuit of claim 11 wherein the regulated DC source is coupled to the first base of the first transistor through a resistor.

15. The power sensing circuit of claim 11 wherein the first base of the first transistor is coupled to the second base of the second transistor through a low-pass filter.

16. The power sensing circuit of claim 11 wherein the size of the first transistor is the same as the size of the second transistor.

17. A power sensing circuit for sensing radio frequency signals, comprising:
   a) a first transistor to perform as a detector diode, including
      i) a first base to receive a first radio frequency input signal output, a second DC bias signal from a regulated DC source coupled through a resistor, and a third power-sensing signal; and
      ii) a first collector connected to the first base;
   b) a second transistor to amplify the DC component of the RF signal from the first base, including
      i) a second base connected to the first base through a low-pass filter; and
      ii) a second collector to output the power-sensing signal to be coupled to the regulated DC source through a resistor, said power-sensing signal being substantially proportional to the strength of the first radio frequency input signal; and
   c) an output port coupled to the second collector through a low-pass filter, to output the power-sensing signal.

* * * * *